United States Patent [19]
Lo et al.

[11] Patent Number: 5,691,567
[45] Date of Patent: Nov. 25, 1997

[54] STRUCTURE FOR ATTACHING A LEAD FRAME TO A HEAT SPREADER/HEAT SLUG STRUCTURE

[75] Inventors: Randy H. Y. Lo, Campbell; Boonmi Mekdhanasarn, Sunnyvale; Daniel P. Tracy, San Jose, all of Calif.

[73] Assignee: National Semiconductor Corporation, Santa Clara, Calif.

[21] Appl. No.: 530,772

[22] Filed: Sep. 19, 1995

[51] Int. Cl.$^6$ .......................... H01L 23/495; H01L 23/48
[52] U.S. Cl. .......................... 257/675; 257/783; 257/790; 257/796; 437/209; 437/217; 437/220
[58] Field of Search .......................... 257/675, 676, 257/783, 787, 790, 793, 796; 437/209, 217, 219, 220

[56] References Cited

U.S. PATENT DOCUMENTS

| | | | |
|---|---|---|---|
| 4,783,428 | 11/1988 | Kalfus | 437/209 |
| 5,068,708 | 11/1991 | Newman | 357/68 |
| 5,208,188 | 5/1993 | Newman | 437/220 |

FOREIGN PATENT DOCUMENTS 6-151662  6/1994  Japan.

OTHER PUBLICATIONS

Patent Abstract of JP-6-151662, Jun. 1994, Japan.

*Primary Examiner*—Tom Thomas
*Assistant Examiner*—David Ostrowski
*Attorney, Agent, or Firm*—Skjerven, Morrill, MacPherson, Franklin & Friel

[57] ABSTRACT

A method and structure for attaching a lead frame to a heat sink are provided. In one embodiment, a layer of thermally conductive, electrically insulating epoxy is formed on a heat sink and the epoxy layer is fully cured. A thermoplastic adhesive layer is formed on the epoxy layer, and the heat sink is clamped to the lead frame such that the thermoplastic layer contacts the lead frame. The thermoplastic layer is heated to its melting point and then cooled, thereby joining the heat sink and the lead frame. In a variation, a partially cured B-stage epoxy layer is used to replace the thermoplastic layer. The B-stage epoxy layer is fully cured to connect the lead frame to the heat sink.

8 Claims, 6 Drawing Sheets

STRUCTURE FOR ATTACHING A LEAD FRAME TO A HEAT SPREADER/HEAT SLUG STRUCTURE

FIELD OF THE INVENTION

This invention relates to a semiconductor device having a heat sink attached to a lead frame and a method for making the same. More particularly, the present invention relates to a method and structure for attaching a heat spreader or heat slug to a lead frame.

BACKGROUND OF THE INVENTION

Figure 1A:
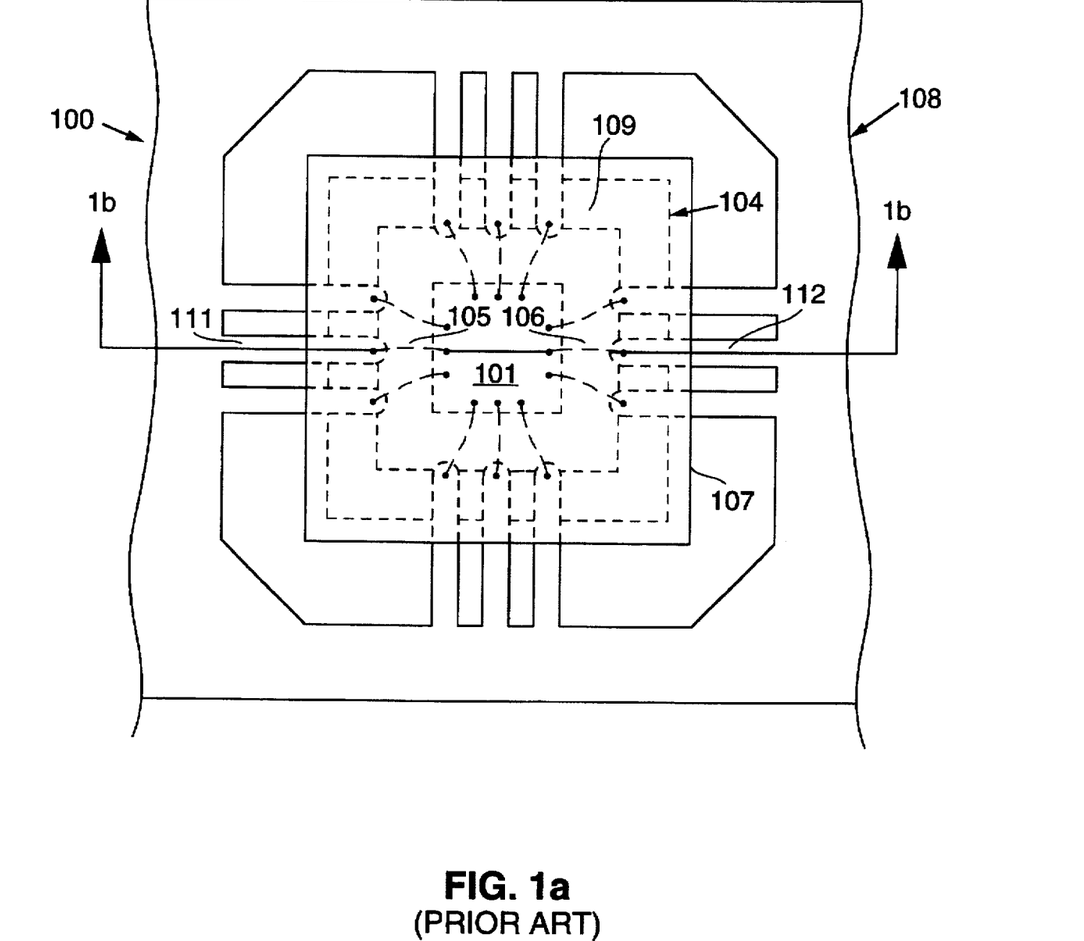
FIG. 1a is a top view of a conventional semiconductor device.
Figure 1B:
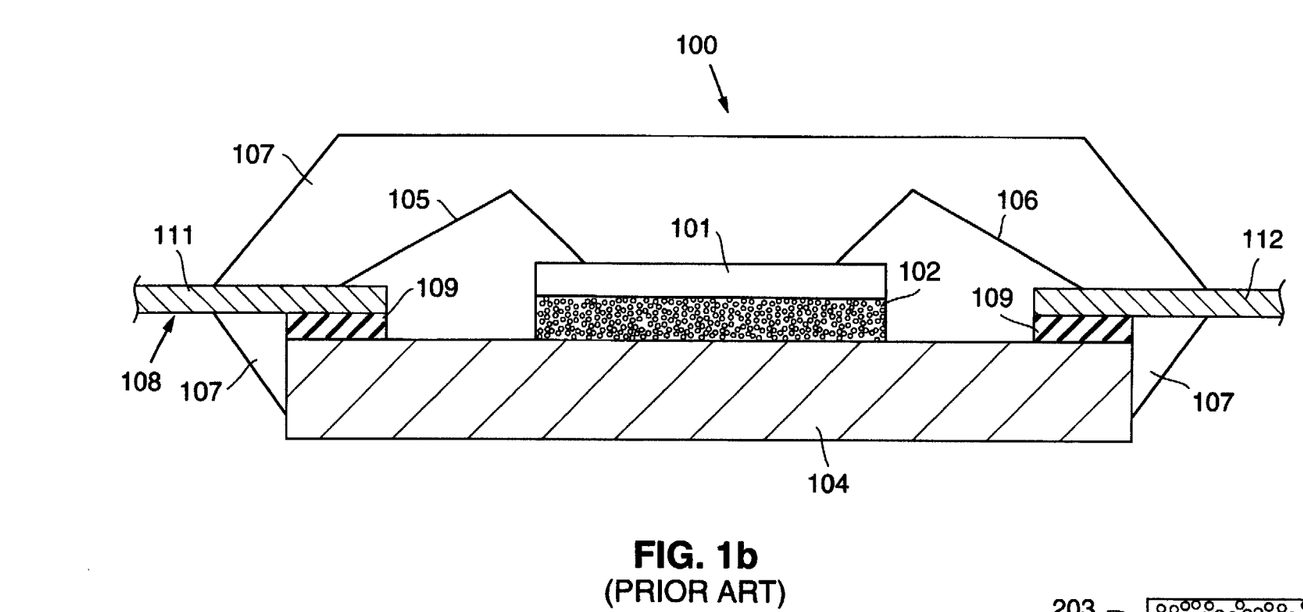

FIG. 1a is a top view of a semiconductor device 100 which includes semiconductor die 101, die attach adhesive 102, heat slug 104, bonding wires 105–106, molding compound 107, lead frame 108 (which includes leads 111 and 112) and double-sided polyimide tape 109. Elements which are encased in molding compound 107 are shown in dashed lines in FIG. 1a. FIG. 1b is a cross sectional view of semiconductor device 100 along plane 1b—1b of FIG. 1a.

Heat slug 104 is used to dissipate heat generated within device 100 during operation of device 100. Heat generated within semiconductor die 101 is conducted through die attach adhesive 102 to heat slug 104. Heat slug 104 is typically a metal, such as copper or aluminum, which has a high thermal conductivity. Heat slug 104 conducts heat to the environment external to device 100 and thereby prevents heat build-up in the vicinity of die 101. As illustrated in FIG. 1b, the bottom portion of heat slug 104 extends through molding compound 107 such that this portion is exposed to the outside environment. A heat spreader (not shown) is similar to heat slug 104, except that a heat spreader is totally encapsulated by molding compound 107 (i.e., is not exposed to the outside environment). Heat spreaders and heat slugs are hereinafter generically referred to as heat sinks.

Polyimide tape 109 is used to connect heat sink 104 to lead frame 108. Polyimide tape 109 is typically positioned around the perimeter of the upper surface of heat sink 104. The leads of lead frame 108 (including leads 111 and 112) are positioned on polyimide tape 109, such that polyimide tape connects heat sink 104 and lead frame 108. After heat sink 104 is connected to lead frame 108, die 101 is attached to central area of the upper surface of heat sink 104 using die attach adhesive 102. Polyimide tape 109 holds heat sink 104 and lead frame 108 in a fixed relationship when molding compound 107 is formed around the various elements of semiconductor device 100.

Figure 2:
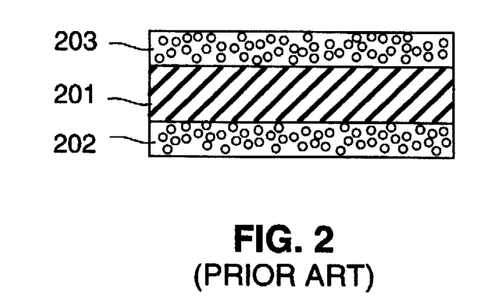
FIG. 2 is a cross sectional view of conventional polyimide tape.

FIG. 2 is a cross sectional view of tape 109, which includes polyimide layer 201 and adhesive layers 202 and 203. Polyimide tape 109 is thermally conductive and electrically insulating. As a result, heat received by heat sink 104 is conducted through polyimide tape 109 to lead frame 108. However, because polyimide tape 109 is electrically insulating, polyimide tape 109 does not short the various leads of lead frame 108.

To attach heat sink 104 to lead frame 108, adhesive layer 202 is placed on heat sink 104, thereby fixing polyimide tape 109 to heat sink 104. Lead frame 108 is then positioned on adhesive layer 203, thereby fixing polyimide tape 109 to lead frame 108. Lead frame 108 and heat sink 104 are then clamped together and polyimide tape 109 is heated, thereby curing adhesive layers 202 and 203 and attaching lead frame 108 to heat sink 104. Lead frame 108 must be placed on adhesive layer 203 shortly after adhesive layer 202 is placed on heat sink 104 to prevent adhesive layer 203 from becoming contaminated by exposure to the environment.

Polyimide tape 109 is relatively expensive because adhesive layers 202 and 203 must be laminated onto each side of polyimide layer 201. Moreover, if polyimide tape 109 is improperly clamped between heat sink 104 and lead frame 108, gaps may exist between adhesive layer 202 and heat sink 104 and/or between adhesive layer 203 and lead frame 108. As a result, poor adhesion may exist between heat sink 104 and lead frame 108. Further contributing to this problem, polyimide tape 109 has a tendency to warp, thereby promoting a sub-optimal connection between lead frame 108 and heat sink 104. Additionally, polyimide layer 201 must have a minimum thickness, typically more than one mil, to form a film. As polyimide layer 201 becomes thicker, the ability of polyimide tape 109 to conduct heat is reduced.

U.S. Pat. No. 4,783,428 issued to Kalfus discloses another method for coupling a lead frame to a heat sink. In Kalfus, a first layer of thermally conductive epoxy is screen printed onto a heat sink. The first layer of epoxy is cured and a second layer of thermally conductive epoxy is screen printed on the first layer of epoxy. A lead frame is then placed on the second layer of epoxy and the second layer of epoxy is cured to attach the lead frame to the heat sink. The lead frame must be connected to the heat sink soon after the second layer of epoxy is screen printed to prevent contamination of the second layer of epoxy.

It would therefore be desirable to have a method and structure for attaching a lead frame to a heat sink which overcomes the above described short-comings of polyimide tape. It would also be desirable if this method and structure provided a heat sink which (1) includes the materials necessary to connect the heat sink to the lead frame, and (2) can be conveniently stored for long periods of time until the heat sink is to be connected to the lead frame.

SUMMARY

Accordingly, the present invention provides a semiconductor device which includes a heat sink and a lead frame. A fully cured layer of thermally conductive epoxy is connected to the heat sink and a layer of thermoplastic is connected to the fully cured epoxy layer. The lead frame is connected to the layer of thermoplastic. Both the epoxy layer and the thermoplastic layer are applied in paste form, thereby substantially eliminating the adhesion problems previously associated with the use of polyimide tape 109.

The epoxy and thermoplastic layers can be formed in a variety of ways. In one embodiment, the fully cured epoxy layer is formed on the heat sink and the thermoplastic layer is formed over the fully cured epoxy layer. The resulting structure can advantageously be stored until the heat sink is connected to the lead frame. In another example, the fully cured epoxy layer is formed on the heat sink and the thermoplastic layer is formed on the lead frame. Again, the resulting structures can be stored (separately) until the heat sink is to be connected to the lead frame.

In another embodiment, the fully cured epoxy layer is connected to the lead frame (instead of the heat sink) and the thermoplastic layer is connected to the heat sink (instead of the lead frame). Again, the epoxy layer is connected to the thermoplastic layer. In this embodiment, the epoxy and thermoplastic layers can be formed in a variety of different ways. In one example, the fully cured epoxy layer is formed on the lead frame and the thermoplastic layer is formed over the fully cured epoxy layer. Alternatively, the fully cured epoxy layer is formed on the lead frame and the thermoplastic layer is formed on the heat sink. Again, the resulting structures can be stored until the heat sink is to be connected to the lead frame.

In accordance with another embodiment of the invention, a heat sink structure includes a thermally conductive heat sink, a fully cured first layer of thermally conductive epoxy located over the heat sink, and a partially cured second layer of thermally conductive B-stage epoxy located over the first layer of epoxy. The first and second layers of epoxy are applied in paste form and the resulting heat sink structure can be stored until the heat sink structure is connected to a lead frame. When the heat sink structure is to be connected to the lead frame, these structures are positioned such that the partially cured second epoxy layer is contacting the lead frame. The second epoxy layer is then fully cured, thereby connecting the heat sink structure to the lead frame.

In a variation, the fully cured epoxy layer is formed on the heat sink and the partially cured epoxy layer is formed on the lead frame. In another variation, the fully cured epoxy layer is formed on the lead frame (rather than the heat sink) and the partially cured epoxy layer is formed on the fully cured epoxy layer. In yet another variation, the fully cured epoxy layer is formed on the lead frame and the partially cured epoxy layer is formed on the heat sink.

The present invention will be more fully understood in light of the following detailed description taken together with the drawings.

BRIEF DESCRIPTION OF THE DRAWINGS

FIG. 1b is a cross sectional view along plane 1b—1b of FIG. 1a;

FIG. 3b is a cross sectional view along plane 3b—3b of FIG. 3a;

DETAILED DESCRIPTION

Figure 3A:
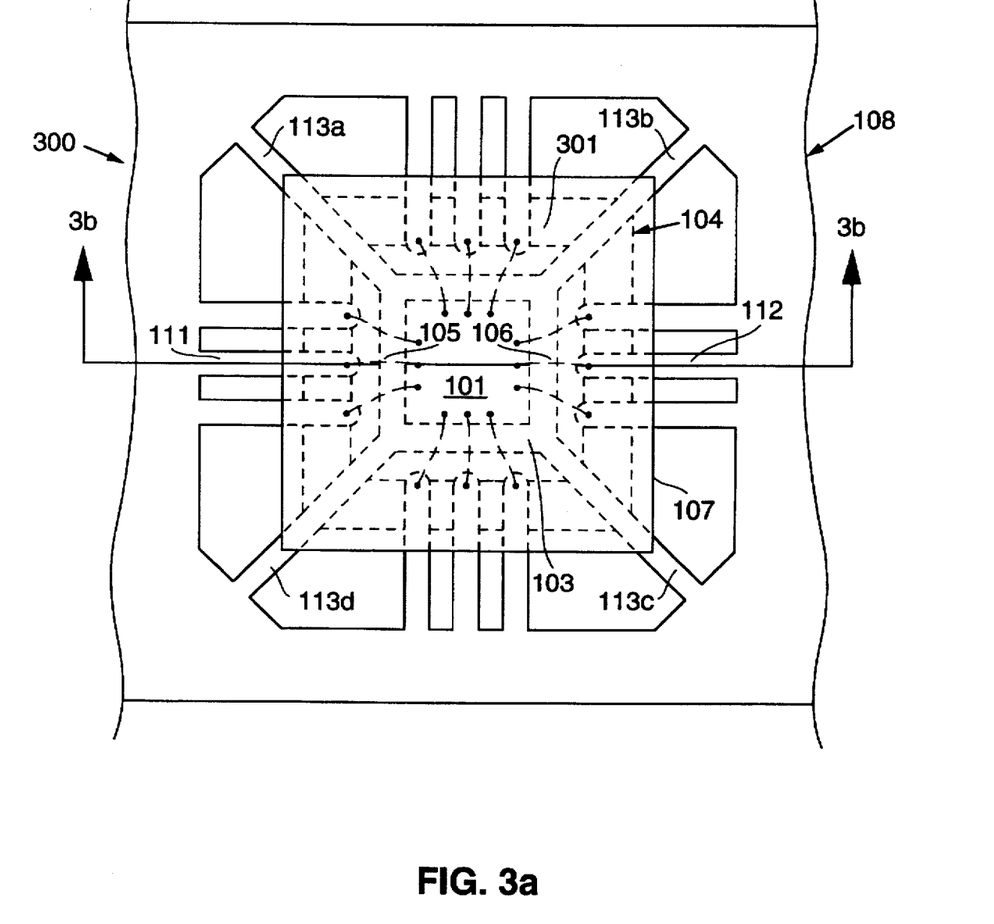
FIG. 3a is a top view of a semiconductor device, including an interconnect layer which joins a heat sink and a lead frame in accordance with one embodiment of the invention.
Figure 3B:
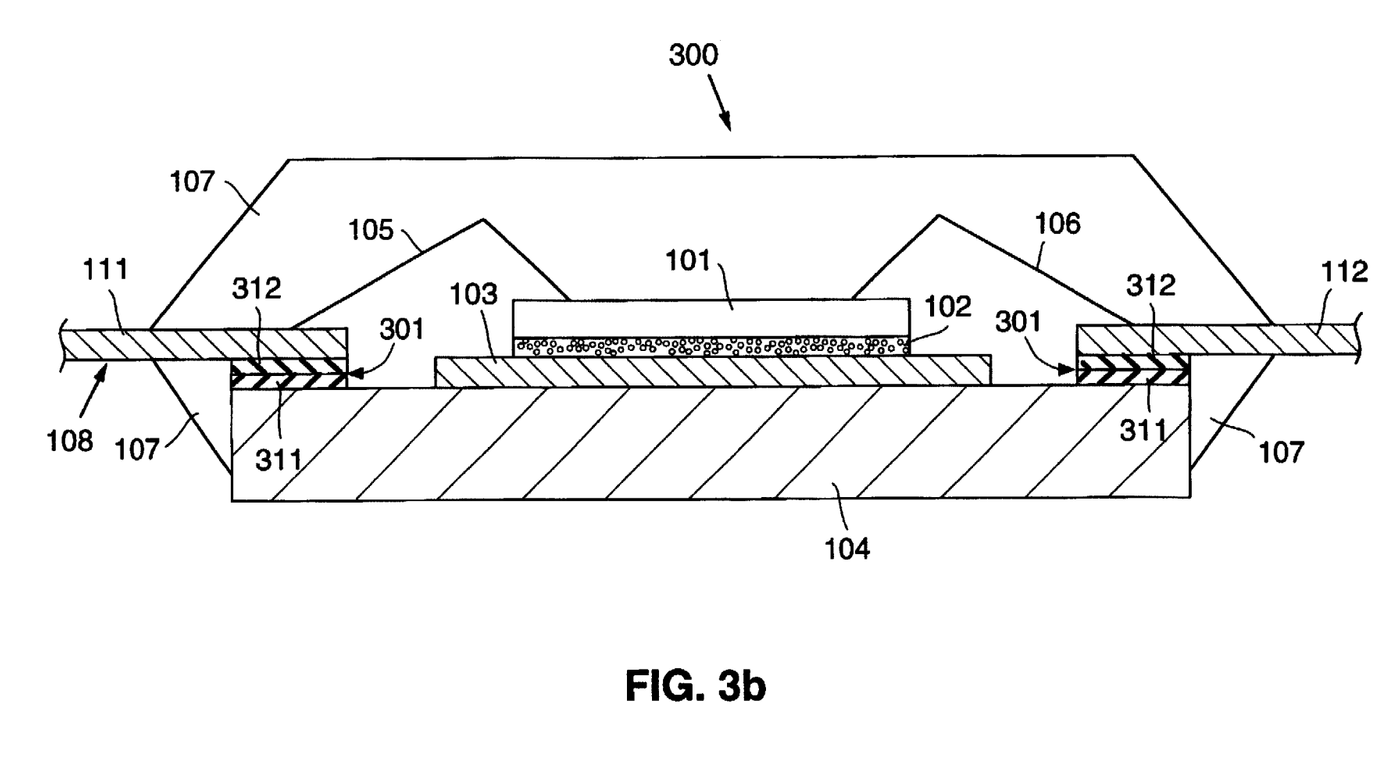

FIG. 3a is a top view of a semiconductor device 300 in accordance with one embodiment of the invention. FIG. 3b is a cross sectional diagram of semiconductor device 300 along section line 3b—3b of FIG. 3a. Semiconductor device 300 is similar to semiconductor device 100 (FIGS. 1a and 1b), with the notable exception of interconnect layer 301. Similar elements in FIGS. 1a, 1b, 3a and 3b are labeled with similar reference numbers. Interconnection layer 301 includes epoxy layer 311 and adhesive layer 312. As described in more detail below, adhesive layer 312 can be a thermoplastic adhesive or a B-stage epoxy.

Figure 4A:
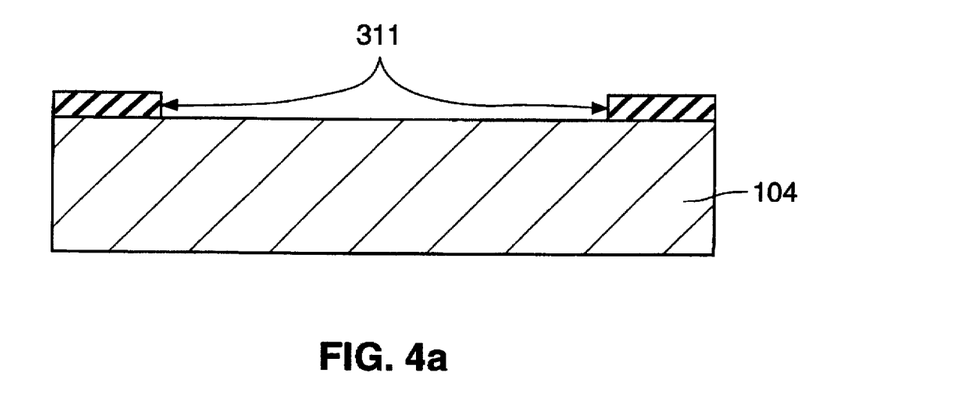
FIGS. 4a and 4b are cross sectional diagrams illustrating steps used to fabricate an interconnect layer of a semiconductor device in accordance with one embodiment of the invention.
Figure 4B:
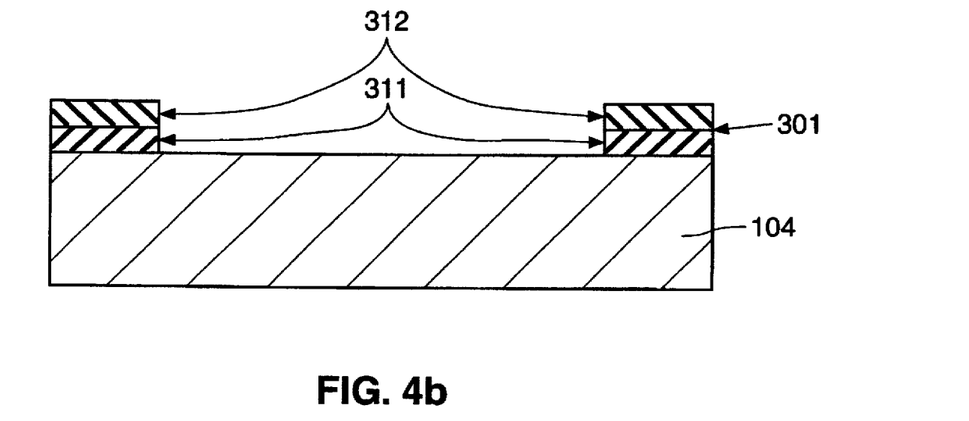

FIGS. 4a and 4b are cross sectional views illustrating the fabrication of interconnect layer 301 in accordance with one embodiment of the invention. Heat sink 104, which is typically a metal such as aluminum or copper, has a high thermal conductivity. Epoxy layer 311 is a thermally conductive, electrically insulating layer applied to heat sink 104 using a conventional technique such as screen printing or roll coating. To form epoxy layer 311 in the ring-like pattern illustrated in FIG. 3a, conventional masking steps are performed to prevent the epoxy material from being deposited in the undesired locations. Alternatively, a layer of epoxy is formed over the entire upper surface of heat sink 104, and the undesired portions of epoxy are etched away to form epoxy layer 311.

After epoxy layer 311 is applied to heat sink 104, epoxy layer 311 is fully cured to create a hard, solid layer which will not melt when exposed to high temperatures experienced during subsequent processing steps (FIG. 4a). Epoxy layer 311 can be any thermally conductive, electrically insulating epoxy that can be applied in a thin layer and then be fully cured. In a particular embodiment, epoxy layer 311 is Ablebond 961-6, a B-stage epoxy which is available from Ablestik Laboratories in a paste form. Ablebond 961-6 is deposited on heat sink 104 and then fully cured by heating the epoxy for 2 hours at 180° C. In the described embodiment, epoxy layer 311 is 0.25 to 0.5 mils thick, although other thicknesses are possible. A thinner epoxy layer 311 results in greater heat transfer between lead frame 108 and heat sink 104. Therefore, epoxy layer 311 should be made as thin as possible while maintaining the continuity of the layer 311.

After epoxy layer 311 has been fully cured, adhesive layer 312 is formed over epoxy layer 311 (FIG. 4b). In the present embodiment, adhesive layer 312 is made of a thermoplastic material and will be referred to as thermoplastic adhesive layer 312. Thermoplastic adhesive layer 312 has a high thermal conductivity and is available in a paste form which can be applied to epoxy layer 311 by screen printing, roll coating, or another conventional technique. Thermoplastic adhesive layer 312 is also electrically insulating. In one embodiment, thermoplastic adhesive layer 312 is made of 211GZ, a thermoplastic available from AlphaMetal, Inc. The 211GZ thermoplastic adhesive is typically used to attach semiconductor die to lead frames. The 211GZ thermoplastic is deposited to a thickness of approximately one mil in the described embodiment, although other thicknesses are possible and are considered within the scope of the invention. Thermoplastic adhesive layer 312 forms a solid layer over epoxy layer 311. Thus, after thermoplastic adhesive layer 312 is formed over epoxy layer 311, the resulting structure (as illustrated in FIG. 4b) can be set aside and stored until it is needed for connection to lead frame 108. This represents a significant improvement over conventional interconnect layers.

To connect heat sink 104 to lead frame 108, heat sink 104 is mechanically clamped to lead frame 108, such that thermoplastic adhesive layer 312 contacts lead frame 108. The clamped structure is then heated until thermoplastic adhesive layer 312 melts. In the described example, the 211GZ thermoplastic layer melts at approximately 325° C. Thermoplastic adhesive layer 312 is then cooled until it returns to its original solid state, thereby connecting heat sink 104 to lead frame 108. The mechanical clamps are then removed.

When thermoplastic adhesive layer 312 is heated to liquid form, the clamping force applied to heat sink 104 and lead frame 108 may cause portions of lead frame 108 to extend through thermoplastic adhesive layer 312. If this occurs, lead frame 108 will contact electrically insulating epoxy layer 311 and will therefore not be shorted to heat sink 104.

The melting point of thermoplastic adhesive layer 312 should be higher than the processing temperatures used for subsequent fabrication steps. For example, if the bonding of wires 105 and 106 to lead frame 108 requires a temperature of 200° C. (and this bonding is performed after heat sink 104 is connected to lead frame 108), then the melting point of thermoplastic adhesive layer 312 should be greater than 200° C. If a solder reflow operation is also performed, and this reflow operation requires a temperature of 245° C., then the melting point of thermoplastic adhesive layer 312 should be greater than 245° C. This prevents lead frame 108 from becoming disconnected from heat sink 104 during these subsequent processing steps.

Semiconductor die 101 is connected to die attach pad 103 of the lead frame using die attach adhesive 102. As shown in FIG. 3a, die attach pad 103 is supported by tie bars 113a–11d. Die 101 can be connected to die attach pad 103 before or after lead frame 108 is connected to heat sink 104. When lead frame 108 is connected to heat sink 104, die attach pad 103 is forced into contact with heat sink 104. In an alternative embodiment, the die attach pad 103 and tie bars 113a–113d are eliminated from the lead frame structure. In such an embodiment, die 101 is connected to heat sink 104 using die attach adhesive 102 in a manner similar to that illustrated in FIG. 1b.

Figure 5:
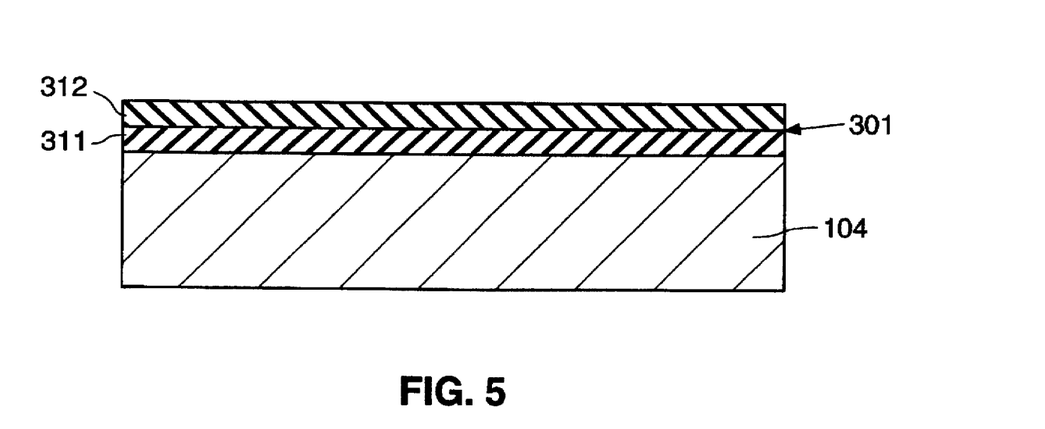
FIGS. 5–8 are cross sectional diagrams illustrating structures for various interconnect layers in accordance with the invention.

FIGS. 5–8 illustrate alternative embodiments of the present invention. As illustrated in FIG. 5, interconnect layer 301 can be extended across the entire upper surface of heat sink 104. This configuration provides increased adhesion between heat sink 104 and lead frame 108 because interconnect layer 301 is present at the interface between die attach pad 103 of lead frame 108 and heat sink 104. This configuration also reduces the rate of heat transfer between die 101 and heat sink 104 because heat must be transferred through interconnect layer 301.

Figure 6:
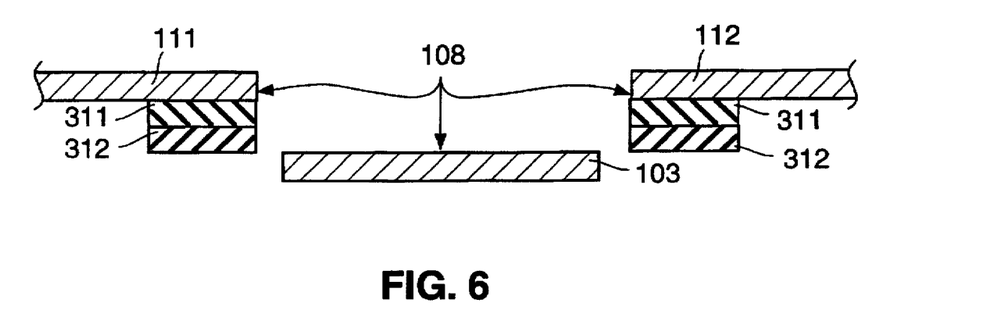

Interconnect layer 301 can also be formed on lead frame 108 instead of heat sink 104 as illustrated in FIG. 6. Epoxy layer 311 is formed on the underside of the leads (including leads 111 and 112) of lead frame 108. Thermoplastic adhesive layer 312 is then formed on epoxy layer 311.

Figure 7:
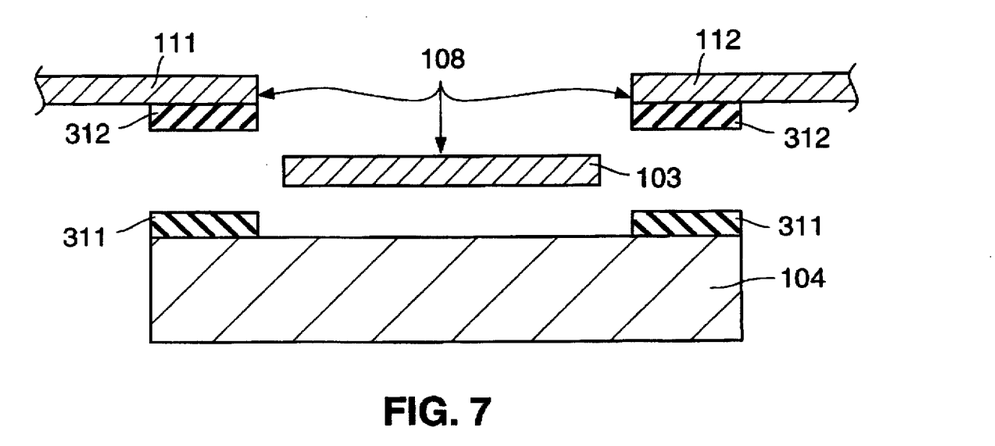
Figure 8:
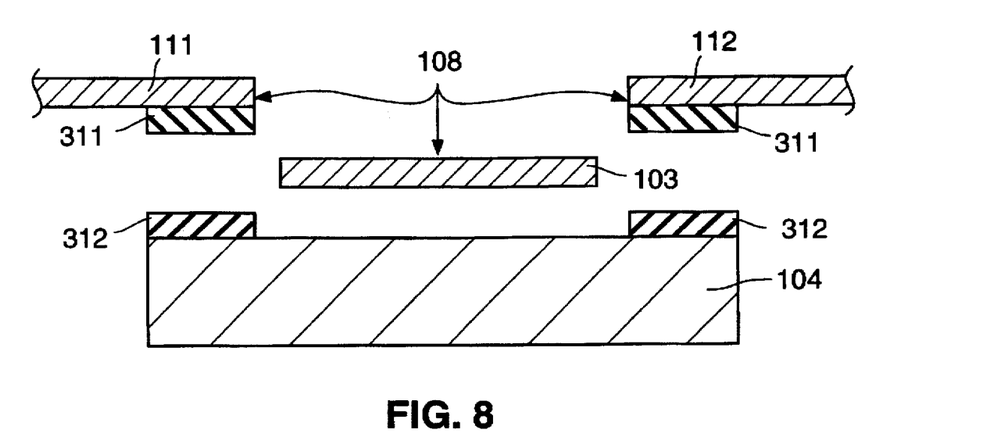

Alternatively, interconnect layer 301 can be split into two parts. In one such an embodiment, epoxy layer 311 is formed on heat sink 104 and thermoplastic adhesive layer 312 is formed on the leads of lead frame 108 (FIG. 7). In a variation of this embodiment, epoxy layer 311 is formed on the underside of the leads of lead frame 108 and thermoplastic adhesive layer 312 is formed on heat sink 104 (FIG. 8).

In addition to the fact that interconnect layer 301 is easily stored, interconnect layer 301 provides several other advantages over conventional interconnect layers. For example, interconnect layer has a much lower cost than polyimide tape 109 (FIG. 2). The low cost of interconnect layer 301 is realized because of the low cost of the pastes used to form epoxy layer 311 and thermoplastic adhesive layer 312. In contrast, it is relatively expensive to laminate adhesive layers onto both sides of the polyimide tape 109.

Moreover, epoxy paste and thermoplastic adhesive paste form very good bonds to heat sink 104 (or lead frame 108) when these pastes are applied in liquid form. In contrast, the bond between polyimide tape 109 and heat sink 104 may include gaps because of warpage or improper clamping of the solid polyimide tape 109. Additionally, because interconnect layer 301 is formed by screen printing or roll coating the epoxy and thermoplastic adhesive pastes, interconnect layer 301 can be made thinner than polyimide tape 109. As a result, interconnect layer 301 provides greater thermal conductivity between lead frame 108 and heat sink 104.

In another embodiment of the present invention, adhesive layer 312 is made of a B-stage epoxy material rather than a thermoplastic. In this embodiment, adhesive layer 312 is referred to as B-stage epoxy layer 312. The B-stage epoxy material used for layer 312 is an epoxy material that can be partially cured to produce a material which is hardened at room temperature and which can be fully cured at a later time. Ablebond 961-6 is one example of a B-stage epoxy material. In one embodiment, B-stage epoxy layer 312 is formed by screen printing or roll coating a layer of Ablebond 961-6 over fully cured epoxy layer 311. FIG. 4b is representative of the resulting structure. B-stage epoxy layer 312 is then partially cured. For example, Ablebond 961-6 can be partially cured by heating this epoxy material for one half hour at 120° C. After the partial cure is completed, B-stage epoxy layer 312 takes a solid form which can be easily stored until lead frame 108 is to be attached to heat sink 104.

To attach lead frame 108 to heat sink 104, lead frame 108 and heat sink 104 are clamped together, such that partially cured B-stage epoxy layer 312 contacts lead frame 108. B-stage epoxy layer 312 is then fully cured in the manner previously described in connection with epoxy layer 311. When B-stage epoxy layer 312 is fully cured, lead frame 108 is connected to heat sink 104 via fully cured epoxy layers 311 and 312. High temperatures experienced during subsequent processing steps will have little to no effect on fully cured epoxy layers 311 and 312.

In variations of this embodiment, fully cured epoxy layer 311 and partially cured B-stage epoxy layer 312 can be fabricated in accordance with any of the configurations set forth in FIGS. 5–8.

Although the invention has been described in connection with several embodiments, it is understood that this invention is not limited to the embodiments disclosed, but is capable of various modifications which would be apparent to one of ordinary skill in the art. Thus, the invention is limited only by the following claims.

What is claimed is:

1. A semiconductor device comprising:
   a heat sink;
   a fully cured layer of thermally conductive, electrically insulating epoxy connected to a portion of the heat sink;
   a layer of thermally conductive, electrically insulating thermoplastic connected to the layer of epoxy; and
   a lead frame connected to the layer of thermoplastic.

2. A semiconductor device comprising:
   a lead frame;
   a fully cured layer of thermally conductive, electrically insulating epoxy connected to a portion of the lead frame;
   a layer of thermally conductive, electrically insulating thermoplastic connected to the layer of epoxy; and
   a heat sink connected to the layer of thermoplastic.

3. A heat sink structure comprising:
   a thermally conductive heat sink;
   a fully cured first layer of thermally conductive, electrically insulating epoxy connected to the heat sink; and
   a partially cured second layer of thermally conductive, electrically insulating B-stage epoxy connected to the first layer of epoxy.

4. A lead frame structure comprising:
   a lead frame;
   a fully cured first layer of thermally conductive, electrically insulating epoxy connected to the lead frame; and a partially cured second layer of thermally conductive, electrically insulating B-stage epoxy connected to the first layer of epoxy.

5. A heat sink structure comprising:

a thermally conductive heat sink;

a fully cured layer of thermally conductive, electrically insulating epoxy connected to the heat sink; and a layer of thermally conductive, electrically insulating thermoplastic connected to the layer of epoxy.

6. A lead frame structure comprising:

a lead frame;

a fully cured layer of thermally conductive, electrically insulating epoxy connected to the lead frame; and a layer of thermally conductive, electrically insulating thermoplastic connected to the layer of epoxy.

7. A heat sink-lead frame structure for a semiconductor device comprising:

a thermally conductive heat sink having a layer of fully cured thermally conductive, electrically insulating epoxy formed thereon; and a lead frame having a layer of thermally conductive, electrically insulating thermoplastic formed thereon, wherein the heat sink and the layer of fully cured epoxy are stored separate from the lead frame and the layer of thermoplastic prior to a subsequent joining of the layer of fully cured epoxy and the layer of thermoplastic to form the heat sink-lead frame structure.

8. A heat sink-lead frame structure for a semiconductor device comprising:

a lead frame having a layer of fully cured thermally conductive, electrically insulating epoxy formed thereon; and a thermally conductive heat sink having a layer of thermally conductive, electrically insulating thermoplastic formed thereon, wherein the lead frame and the layer of fully cured epoxy are stored separate from the heat sink and the layer of thermoplastic prior to a subsequent joining of the layer of fully cured epoxy and the layer of thermoplastic to form the heat sink-lead frame structure.

* * * * *